US011488540B2

(12) United States Patent
Hu (10) Patent No.: US 11,488,540 B2
(45) Date of Patent: Nov. 1, 2022

(54) SHIFT REGISTER FOR OUTPUTTING MULTIPLE DRIVING SIGNALS, DRIVING METHOD THEREOF, AND GATE DRIVING CIRCUIT AND DISPLAY PANEL USING THE SAME

(71) Applicants: Chengdu BOE Optoelectronics Technology Co., Ltd., Chengdu (CN); BOE TECHNOLOGY GROUP CO., LTD., Beijing (CN)

(72) Inventor: Qian Hu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/425,431

(22) PCT Filed: Jan. 13, 2021

(86) PCT No.: PCT/CN2021/071452
§ 371 (c)(1),
(2) Date: Jul. 23, 2021

(87) PCT Pub. No.: WO2021/143718
PCT Pub. Date: Jul. 22, 2021

(65) Prior Publication Data
US 2022/0101795 A1 Mar. 31, 2022

(30) Foreign Application Priority Data
Jan. 16, 2020 (CN) .......................... 202010048515.4

(51) Int. Cl.
G09G 5/00 (2006.01)
G09G 3/3266 (2016.01)
(Continued)

(52) U.S. Cl.
CPC ........... *G09G 3/3266* (2013.01); *G11C 19/28* (2013.01); *G09G 3/20* (2013.01); *G09G 3/3233* (2013.01);
(Continued)

(58) Field of Classification Search
CPC ......... G09G 3/3266; G09G 2310/0286; G09G 2310/061; G09G 2310/08;
(Continued)

(56) References Cited

U.S. PATENT DOCUMENTS 10,204,567 B2    2/2019   Yang et al.
10,658,060 B2    5/2020   Li
(Continued)

FOREIGN PATENT DOCUMENTS

CN    105609058 A    5/2016
CN    106952602 A    7/2017
(Continued)

OTHER PUBLICATIONS

International Search Report and Written Opinion for International Application No. PCT/CN2021/071452 dated Apr. 16, 2021.

*Primary Examiner* — Adam J Snyder
(74) *Attorney, Agent, or Firm* — Perilla Knox & Hildebrandt LLP; Kenneth A. Knox (57) ABSTRACT

The disclosure relates to the field of display technology and proposes a shift register, a driving method thereof, a gate driving circuit, and a display panel. The shift register includes a shift register circuit and a data processing circuit. The shift register circuit is configured to output a first shift signal to a first output terminal. The data processing circuit is connected to the first output terminal and a second output terminal, and configured to output a second shift signal to the second output terminal according to the first shift signal of the first output terminal. The second shift signal can be
(Continued)

used as other driving signals in the pixel driving circuit, thereby avoiding a need to provide additional driving circuits and signal lines corresponding to the driving signal.

15 Claims, 9 Drawing Sheets

(51) Int. Cl.
  *G11C 19/28* (2006.01)
  *G09G 3/3233* (2016.01)
  *G09G 3/20* (2006.01)
(52) U.S. Cl.
  CPC ............... *G09G 2300/0408* (2013.01); *G09G 2300/0842* (2013.01); *G09G 2310/0251* (2013.01); *G09G 2310/0286* (2013.01); *G09G 2310/061* (2013.01); *G09G 2310/08* (2013.01); *G09G 2330/021* (2013.01)
(58) Field of Classification Search
  CPC ..... G09G 2330/021; G09G 2300/0408; G09G 2300/0842; G09G 2310/0251; G09G 3/3233; G09G 3/20; G11C 19/28
  See application file for complete search history.

(56) References Cited

U.S. PATENT DOCUMENTS

| | | | | |
|---|---|---|---|---|
| 2014/0071114 | A1* | 3/2014 | Kim | G09G 3/3266 345/212 |
| 2017/0083155 | A1* | 3/2017 | Yang | G09G 3/3266 |
| 2017/0140836 | A1* | 5/2017 | Ma | G09G 3/20 |
| 2017/0193927 | A1* | 7/2017 | Yang | G09G 3/3426 |
| 2017/0287423 | A1* | 10/2017 | Yang | G09G 3/3266 |
| 2019/0385533 | A1* | 12/2019 | Liu | G09G 3/3266 |
| 2019/0385687 | A1* | 12/2019 | Li | G09G 3/3266 |
| 2020/0342808 | A1 | 10/2020 | Han et al. | |

FOREIGN PATENT DOCUMENTS

| | | |
|---|---|---|
| CN | 108039150 A | 5/2018 |
| CN | 109584799 A | 4/2019 |
| CN | 110033734 A | 7/2019 |
| CN | 110313028 A | 10/2019 |
| CN | 110689848 A | 1/2020 |
| CN | 110689848 B | 4/2020 |
| CN | 111179805 A | 5/2020 |
| KR | 20180036396 A | 4/2018 |
| WO | 2020215890 A1 | 10/2020 |
| WO | 2020228017 A1 | 11/2020 |

* cited by examiner

SHIFT REGISTER FOR OUTPUTTING MULTIPLE DRIVING SIGNALS, DRIVING METHOD THEREOF, AND GATE DRIVING CIRCUIT AND DISPLAY PANEL USING THE SAME

CROSS-REFERENCES TO RELATED APPLICATIONS

This application is a national application under 35 U.S.C. § 371 of International Application No. PCT/CN2021/071452, filed Jan. 13, 2021, which claims the benefit of and priority to Chinese Patent Application No. 202010048515.4 filed on Jan. 16, 2020 entitled "Shift Register, Driving Method thereof, Gate Driving Circuit, and Display Panel," the contents of both which are incorporated by reference in their entireties herein as part of the present disclosure.

TECHNICAL FIELD

The present disclosure relates to the technical field of display and, in particular, to a shift register, a driving method thereof, a gate driving circuit, and a display panel.

BACKGROUND

In active matrix organic light-emitting diode displays, the light-emitting state of pixel units are generally controlled by a pixel driving circuit. The pixel driving circuit is generally provided with a driving transistor. The output current of the driving transistor can be controlled by controlling a gate voltage of the driving transistor, thereby controlling the light-emitting state of the pixel units. However, due to differences in the electrical properties (e.g., threshold voltages) of the driving transistors in each pixel driving circuit, uneven light emission of the pixel units occur.

In related art, internal compensation of the pixel driving circuit is usually designed to avoid display abnormalities caused by the differences in electrical properties of driving transistors. In the related art, the internal compensation of pixel driving circuit requires more driving signals (e.g., Reset, Gate, and EM signals) to cooperate with each other.

However, in order to provide the above-mentioned driving signals (e.g., Reset, Gate, and EM signals), corresponding driving circuits and signal lines need to be designed on the display panel, thereby increasing power consumption of the display panel and, at the same time, making wiring layout of the display panel more complicated.

It should be noted that the information disclosed in the background section above is only used to enhance understanding background of the disclosure, and therefore may include information that does not constitute the prior art known to those skilled in the art.

SUMMARY

According to an aspect of the disclosure, there is provided a shift register, including a shift register circuit and a data processing circuit, wherein the shift register circuit is configured to output a first shift signal to a first output terminal; and the data processing circuit is connected to the first output terminal and a second output terminal, and configured to output a second shift signal to the second output terminal according to the first shift signal of the first output terminal.

In some exemplary embodiments of the disclosure, the data processing circuit includes an output sub-circuit and a control sub-circuit; wherein the output sub-circuit is connected to the first output terminal, the second output terminal, a first power terminal, a second power terminal, and a first node, and configured to transmit, according to a signal of the first output terminal, a signal of the first power terminal to the second output terminal, or transmit, according to a signal of the first node, a signal of the second power terminal to the second output terminal; and the control sub-circuit is connected to the first output terminal, a first clock signal terminal, and the first node, and configured to input, according to signals of the first output terminal and the first clock signal terminal, a control signal to the first node.

In some exemplary embodiments of the disclosure, the output sub-circuit includes a first switch and a second switch, wherein the first switch is provided with a control terminal connected to the first output terminal, a first terminal connected to the first power terminal, and a second terminal connected to the second output terminal; and the second switch is provided with a control terminal connected to the first node, a first terminal connected to the second power terminal, and a second terminal connected to the second output terminal.

In some exemplary embodiments of the disclosure, the control sub-circuit includes a third switch, a fourth switch and a first capacitor, wherein the third switch is provided with a control terminal connected to the first output terminal, a first terminal connected to the first power terminal, and a second terminal connected to a second node; the fourth switch is provided with a control terminal connected to the first clock signal terminal, a first terminal connected to the second node, and a second terminal connected to the first node; and the first capacitor is connected between the first clock signal terminal and the second node.

In some exemplary embodiments of the disclosure, the shift register is applied to a gate driving circuit of a display panel, the first shift signal is used as a gate driving signal and a reset signal of a pixel driving circuit in the display panel, and the second shift signal is used as an enable signal of the pixel driving circuit in the display panel.

In some exemplary embodiments of the disclosure, the shift register circuit includes an input circuit, an output circuit, a first pull-up circuit and a second pull-up circuit; wherein the input circuit is connected to the second power terminal, a second clock signal terminal, an input signal terminal, a third node, and a fourth node, and configured to transmit, in response to a signal of the second clock signal terminal, a signal of the second power terminal to the fourth node, and transmit, in response to a signal of the second clock signal terminal, a signal of the input signal terminal to the third node; the output circuit is connected to the first power terminal, the fourth node, a third clock signal terminal, the third node, and the first output terminal, and configured to transmit, in response to a signal of the fourth node, a signal of the first power terminal to the first output terminal, and transmit, in response to a signal of the third node, a signal of the third clock signal terminal to the first output terminal; the first pull-up circuit is connected to the second clock signal terminal, the third node, and the fourth node, and configured to transmit, in response to a signal of the third node, a signal of the second clock signal terminal to the fourth node; and the second pull-up circuit is connected to the third node, the fourth node, the first power terminal, and the third clock signal terminal, and configured to transmit, in response to signals of the fourth node and the third clock signal terminal, a signal of the first power terminal to the third node.

In some exemplary embodiments of the disclosure, the shift register circuit further includes: an isolation circuit, connected to the second power terminal, the third node, and the output circuit, and configured to conduct, in response to a signal of the second power terminal, the third node and the output circuit.

In some exemplary embodiments of the disclosure, the input circuit includes a fifth switch and a sixth switch; wherein the fifth switch is provided with a control terminal connected to the second clock signal terminal, a first terminal connected to the input signal terminal, and a second terminal connected to the third node; and the sixth switch is provided with a control terminal connected to the second clock signal terminal, a first terminal connected to the second power terminal, and a second terminal connected to the fourth node. The isolation circuit includes a tenth switch, provided with a control terminal connected to the second power terminal, and a first terminal connected to the third node. The output circuit includes an eleventh switch, a twelfth switch, a second capacitor and a third capacitor; wherein the eleventh switch is provided with a control terminal connected to a second terminal of the tenth switch, a first terminal connected to the third clock signal terminal, and a second terminal connected to the first output terminal; the twelfth switch is provided with a control terminal connected to the fourth node, a first terminal connected to the first power terminal, and a second terminal connected to the first output terminal; the second capacitor is connected between the second terminal of the tenth switch and the first output terminal; and the third capacitor is connected between the first power terminal and the fourth node. The first pull-up circuit includes a seventh switch, provided with a control terminal connected to the third node, a first terminal connected to the second clock signal terminal, and a second terminal connected to the fourth node. The second pull-up circuit includes an eighth switch and a ninth switch; wherein the eighth switch is provided with a control terminal connected to the fourth node, and a first terminal connected to the first power terminal; and the ninth switch is provided with a control terminal connected to the third clock signal terminal, and a first terminal connected to a second terminal of the eighth switch.

In some exemplary embodiments of the disclosure, the first clock signal terminal and the third clock signal terminal share a same signal terminal.

According to an aspect of the disclosure, there is provided a shift register driving method for driving the shift register as described above, including:

outputting the first shift signal to the first output terminal using the shift register circuit; and outputting, according to the first shift signal of the first output terminal, the second shift signal to the second output terminal using the data processing circuit.

In some exemplary embodiments of the disclosure, the data processing circuit includes an output sub-circuit and a control sub-circuit, and the method further includes:

using the output sub-circuit to transmit, according to a signal of the first output terminal, a signal of the first power terminal to the second output terminal, or transmit, according to a signal of the first node, a signal of the second power terminal to the second output terminal; and using the control sub-circuit to input, according to a signal of the first output terminal, a control signal to the first node.

In some exemplary embodiments of the disclosure, the output sub-circuit includes a first switch and a second switch, the control sub-circuit includes a third switch and a fourth switch, and the method further includes:

in a first stage, outputting, using the shift register circuit, an invalid level signal to the first output terminal, and inputting the invalid level signal to the first clock signal terminal;

in a second stage, outputting, using the shift register circuit, a valid level signal to the first output terminal, and inputting the valid level signal to the first clock signal terminal;

in a third stage, outputting, using the shift register circuit, the invalid level signal to the first output terminal, and inputting the invalid level signal to the first clock signal terminal; and in a fourth stage, outputting, using the shift register circuit, the invalid level signal to the first output terminal, and inputting the valid level signal to the first clock signal terminal.

In some exemplary embodiments of the disclosure, the shift register is applied to a gate driving circuit of a display panel, and the second shift signal is used as an enable signal of a pixel driving circuit in the display panel.

According to an aspect of the disclosure, there is provided a gate driving circuit, including a plurality of shift registers as described above, wherein the plurality of the shift registers are cascaded.

In some exemplary embodiments of the disclosure, a first output terminal in a previous stage of shift register is connected to an input signal terminal in a next stage of shift register.

In some exemplary embodiments of the disclosure, the gate driving circuit is applied to a display panel;

the first output terminal in a n-th stage of shift register is configured to provide a reset signal to a n-th row of pixel unit in the display panel;

the second output terminal in the n-th stage of shift register is configured to provide an enable signal to the n-th row of pixel unit in the display panel; and the first output terminal in a (n+1)-th stage of shift register is configured to provide a gate driving signal to the n-th row of pixel unit in the display panel;

where n is a positive integer greater than or equal to 1.

In some exemplary embodiments of the disclosure, a number of stages of the shift register is greater than a number of rows of pixel units in the display panel by 1, and the first output terminal in a last stage of shift register is configured to provide a gate driving signal to a last row of pixel unit.

According to an aspect of the disclosure, there is provided a display panel including the gate driving circuit as described above.

It should be understood that the above general description and the following detailed description are only exemplary and explanatory, rather than being used for limiting the disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the description. Understandably, the drawings in the following description are just some embodiments of the present disclosure. For those of ordinary skill in the art, other drawings may be obtained based on these drawings without creative efforts.

DETAILED DESCRIPTION

Exemplary implementations will now be described more fully with reference to the accompanying drawings. However, the example implementations can be implemented in various forms and should not be construed as limited to the implementations set forth herein; rather, these implementations are provided so that this disclosure will be thorough and complete, and will fully convey the concept of the example implementations to those skilled in the art. The same reference numerals in the drawings indicate the same or similar structures, and thus their detailed descriptions will be omitted.

Although corresponding terms such as "upper" and "lower" are used in this specification to describe the relative relationship between one component and another component, these terms are used in this specification only for convenience, for example, using the direction of the example as shown in the drawings. It can be understood that if the device in the drawings is turned over, the component described as "upper" will become the "lower" component. Other relative terms, such as "high", "low", "top", "bottom", "left" and "right" have similar meanings. When a structure is "on" another structure, it may mean that a certain structure is integrally formed on other structures, or that a certain structure is "directly" installed on other structures, or that a certain structure is "indirectly" installed on other structures through another structure.

The terms "a", "an", and "the" are used to indicate the presence of one or more elements/components or the like; the terms "including" and "have" are used to indicate open-ended inclusion and mean there may be additional elements/components/and the like in addition to the listed elements/components or the like.

Figure 1:
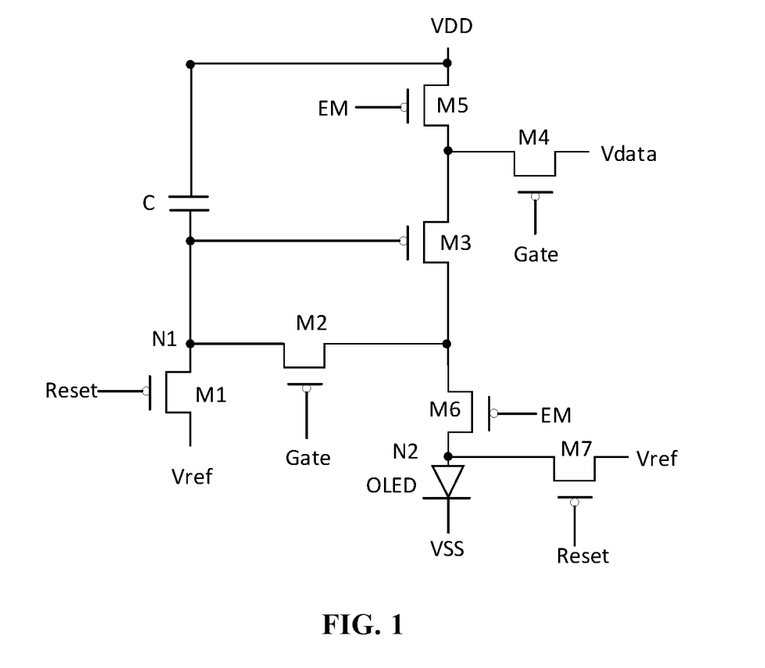
FIG. 1 is a schematic block diagram of a pixel driving circuit in the related art.
Figure 2:
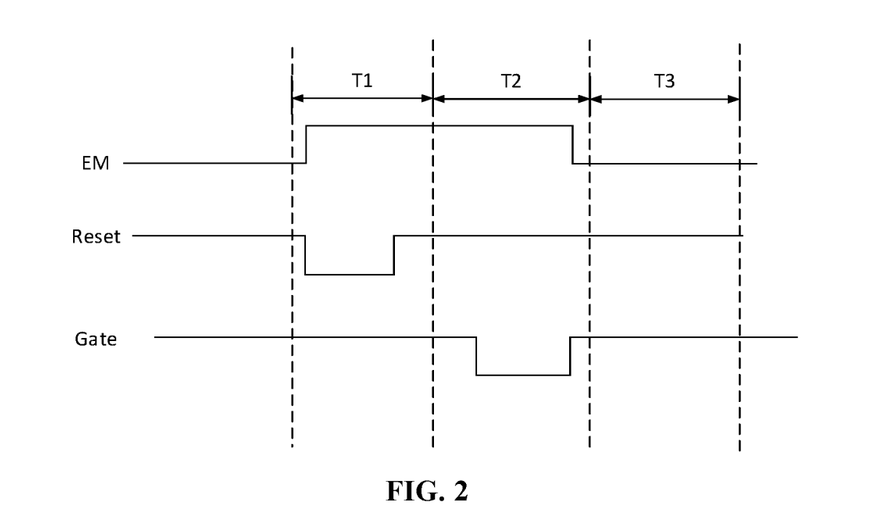
FIG. 2 is a timing diagram of some nodes in the pixel driving circuit of FIG. 1.

As shown in FIGS. 1 and 2, FIG. 1 is a schematic block diagram of a pixel driving circuit in the related art, and FIG. 2 is a timing diagram of some nodes in the pixel driving circuit of FIG. 1. The pixel driving circuit includes first to seventh transistors M1-M7, a capacitor C, and a light-emitting unit OLED, wherein the first to seventh transistors M1-M7 are P-type transistors. The driving method of the pixel driving circuit includes three stages, namely, a reset stage, a compensation stage, and a light-emitting stage.

As shown in FIG. 2, in the reset stage T1, the enable signal terminal EM is provided with a high-level signal, the reset signal terminal Reset is provided with a low-level signal, the gate driving signal terminal Gate is provided with a high-level signal, the first transistor M1 and the seventh transistor M7 are turned on, the second transistor M2, the fourth transistor M4, the fifth transistor M5, and the sixth transistor M6 are turned off, and the reference voltage terminal Vref inputs a reset signal to the first node N1 and the second node N2.

In the compensation stage T2, the enable signal terminal EM is provided with a high-level signal, the reset signal terminal Reset is provided with a high-level signal, the gate driving signal terminal Gate is provided with a low-level signal, the first transistor M1, the seventh transistor M7, the fifth transistor M5 and the sixth transistor M6 are turned off, the second transistor M2 and the fourth transistor M4 are turned on, and the data signal terminal Vdata inputs a compensation voltage V to the first node, where the compensation voltage V=Vdata+Vth, Vdata is the signal voltage of the data signal terminal Vdata, and Vth is the threshold voltage of the third transistor M3.

In the light-emitting stage, the enable signal terminal EM is provided with a low-level signal, the reset signal terminal Reset is provided with a high-level signal, the gate driving signal terminal Gate is provided with a high-level signal, the voltage of the first power terminal VDD transitions from low level to high level, the first transistor M1, the seventh transistor M7, the second transistor M2, and the fourth transistor M4 are turned off, the fifth transistor M5 and the sixth transistor M6 are turned on, and the light-emitting unit OLED emits light under the control of current output by the third transistor M3. Herein, the output current of the third transistor M3 may be determined by $I=w(Vgs-Vth)^2$, where Vg is the gate voltage of the third transistor M3, Vs is the source voltage of the third transistor M3, Vth is the threshold voltage of the third transistor, and w is the mobility of the third transistor M3. Then, the output terminal current of the third transistor M3 may be determined by $I=w(Vgs-Vth)^2=w(Vdata+Vth-VDD-Vth)^2=w(Vdata-VDD)^2$. As can be seen from this formula, the light-emitting state of the light-emitting unit OLED is not related to the threshold voltage of the third transistor M3. Therefore, the phenomenon of uneven light emission of the display panel is avoided. However, the aforementioned reset signal terminal Reset, gate driving signal terminal Gate, and enable signal terminal EM need to be provided with corresponding driving signals through corresponding driving circuits and signal lines, respectively. These driving circuits and signal lines increase power consumption of the display panel, and make wiring layout of the display panel more complicated.

Figure 3:
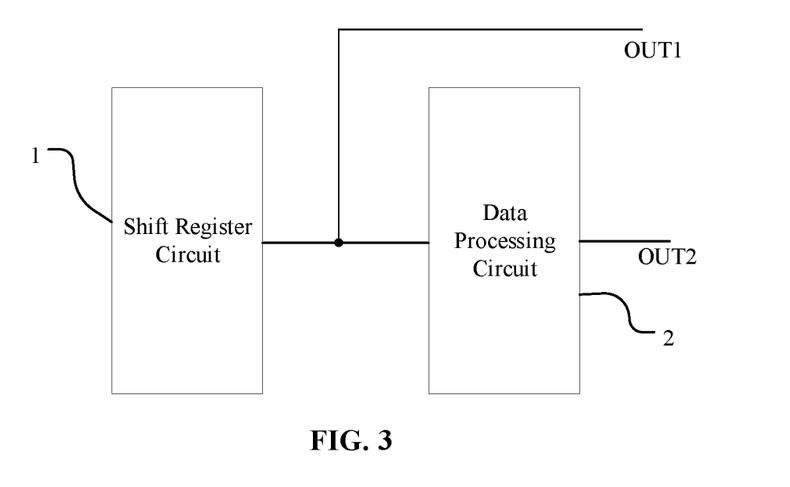
FIG. 3 is a schematic block diagram of the shift register according to an exemplary embodiment of the disclosure.

In view of this, the exemplary embodiments first provides a shift register, as shown in FIG. 3, which is a schematic block diagram of the shift register according to an exemplary embodiment of the disclosure. The shift register includes a shift register circuit 1 and a data processing circuit 2. The shift register circuit 1 is configured to output a first shift signal to the first output terminal OUT1. The data processing circuit 2 is connected to the first output terminal OUT1 and the second output terminal OUT2, and configured to output, according to the first shift signal of the first output terminal OUT1, a second shift signal to the second output terminal OUT2.

In some exemplary embodiments, the second shift signal can be used as other driving signals in the pixel driving circuit, for example, EM (enable signal), Reset (reset signal) and the like. Therefore, the arrangement of the above-mentioned driving circuits and signal lines corresponding to said other driving signals can be avoided, and the driving circuit in the display panel can be simplified.

It should be understood that the shift register provided by the exemplary embodiments can be used in a display panel in conjunction with the pixel driving circuit in FIG. 1, and the shift register provided by the exemplary embodiments can also be used in the display panel in conjunction with other pixel driving circuits. For example, the transistors in FIG. 1 may be N-type transistors, and such pixel driving circuit is not limited in the exemplary embodiments. At the same time, the second shift signal in some exemplary embodiments can also be used as other driving signals in the pixel driving circuit. In addition, the shift register circuit 1 in some exemplary embodiments may be in the form of any circuit structure capable of generating a shift signal.

Figure 4:
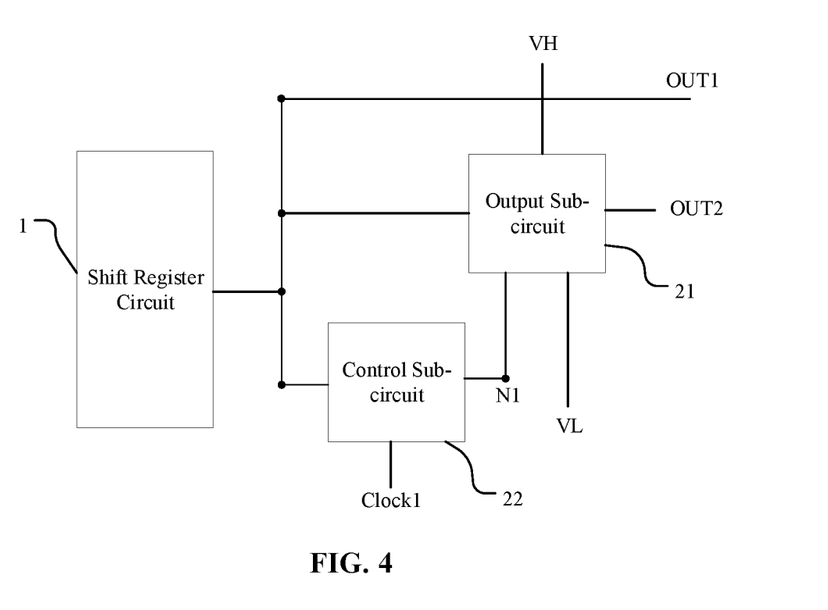
FIG. 4 is a schematic block diagram of the shift register according to another exemplary embodiment of the disclosure.

In some exemplary embodiments, as shown in FIG. 4, it is a schematic block diagram of the shift register according to another exemplary embodiment of the disclosure. The data processing circuit includes an output sub-circuit 21 and a control sub-circuit 22. The output sub-circuit 21 is connected to the first output terminal OUT1, the second output terminal OUT2, the first power terminal VH, the second power terminal VL, and the first node N1, and is configured to transmit, according to a signal of the first output terminal OUT1, a signal of the first power terminal VH to the second output terminal OUT2, or transmit, according to a signal of the first node N1, a signal of the second power terminal VL to the second output terminal OUT2. The control sub-circuit 22 is connected to the first output terminal OUT1, the first clock signal terminal Clock1, and the first node N1, and is configured to input, according to signals of the first output terminal OUT1 and the first clock signal terminal Clock1, a control signal to the first node N1.

The following exemplary embodiments provide a specific data processing circuit structure, so that the shift register can be used in a display panel in cooperation with the pixel driving circuit shown in FIG. 1. Herein, a plurality of the shift registers are cascaded to form a gate driving circuit to provide driving signals to the pixel driving circuits of each row.

Figure 5:
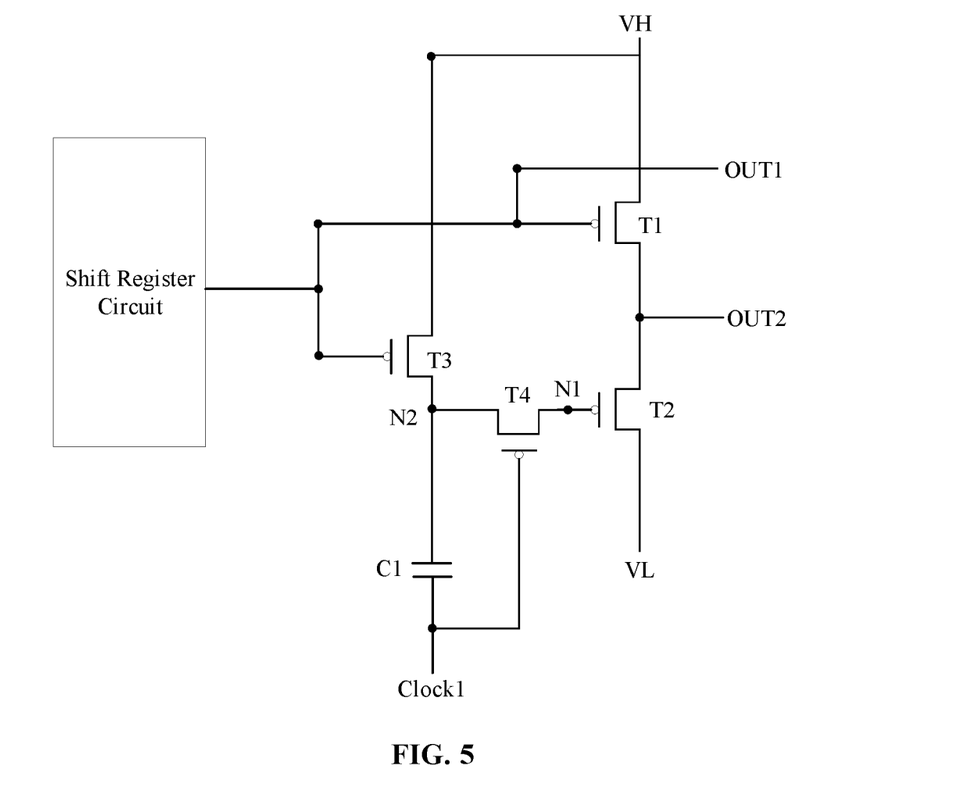
FIG. 5 is a schematic block diagram of the shift register according to another exemplary embodiment of the disclosure.

In some exemplary embodiments, as shown in FIG. 5, which is schematic block diagram of the shift register according to another exemplary embodiment of the disclosure, the output sub-circuit 21 includes a first switch T1 and a second switch T2. The control terminal of the first switch T1 is connected to the first output terminal OUT1, the first terminal thereof is connected to the first power terminal VH, and the second terminal thereof is connected to the second output terminal OUT2. The control terminal of the second switch T2 is connected to the first node N1, the first terminal thereof is connected to the second power terminal VL, and the second terminal thereof is connected to the second output terminal OUT2.

In some exemplary embodiments, as shown in FIG. 5, the control sub-circuit 22 includes a third switch T3, a fourth switch T4, and a first capacitor C1. The control terminal of the third switch T3 is connected to the first output terminal OUT1, the first terminal thereof is connected to the first power terminal VH, the second terminal thereof is connected to the second node N2. The control terminal of the fourth switch T4 is connected to the first clock signal terminal Clock1, the first terminal thereof is connected to the second node N2, and the second terminal thereof is connected to the first node N1. The first capacitor C1 is connected between the first clock signal terminal Clock1 and the second node N2.

In some exemplary embodiments, the first switch to the fourth switch may be P-type transistors or N-type transistors. As shown in FIG. 5, the description is made while taking an example in which the first switch to the fourth switch are P-type transistors.

The driving method of the above shift register is described below.

Figure 6:
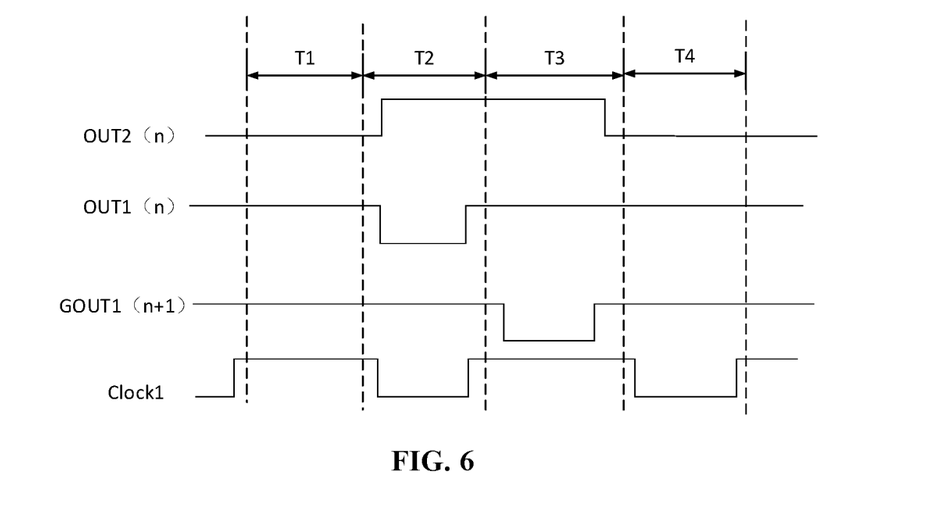
FIG. 6 is a timing diagram of some nodes in the shift register of FIG. 5.
Figure 7:
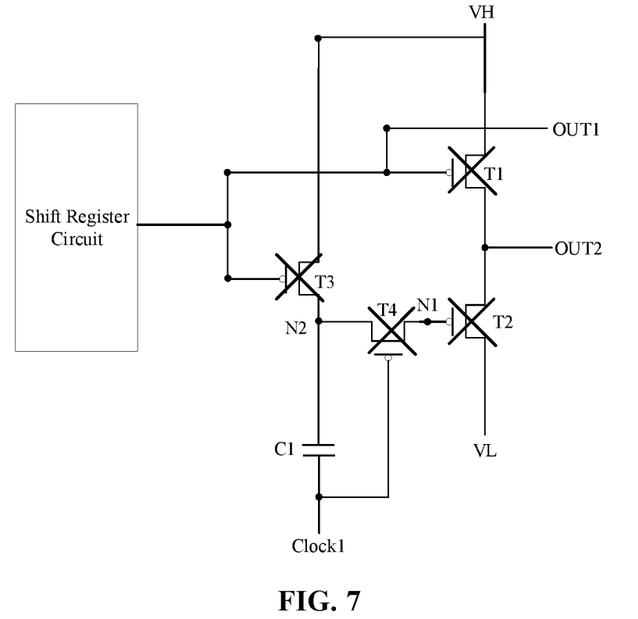
FIGS. 7-10 are state diagrams of the shift register in FIG. 5 during different driving periods.
Figure 8:
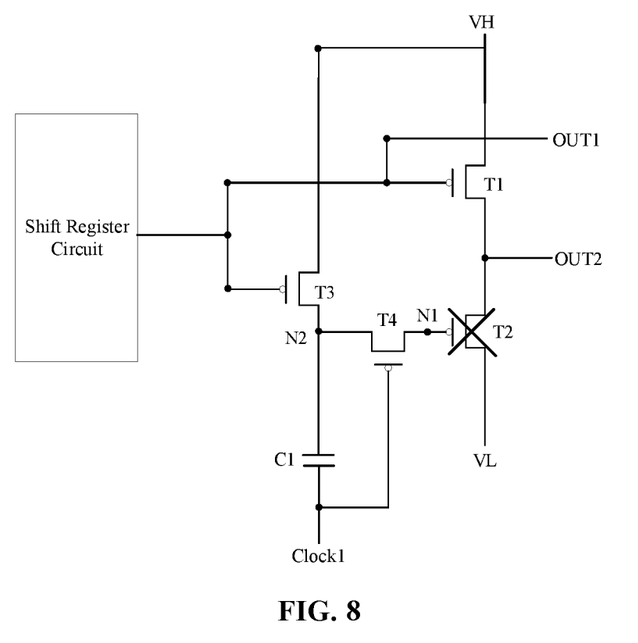
Figure 9:
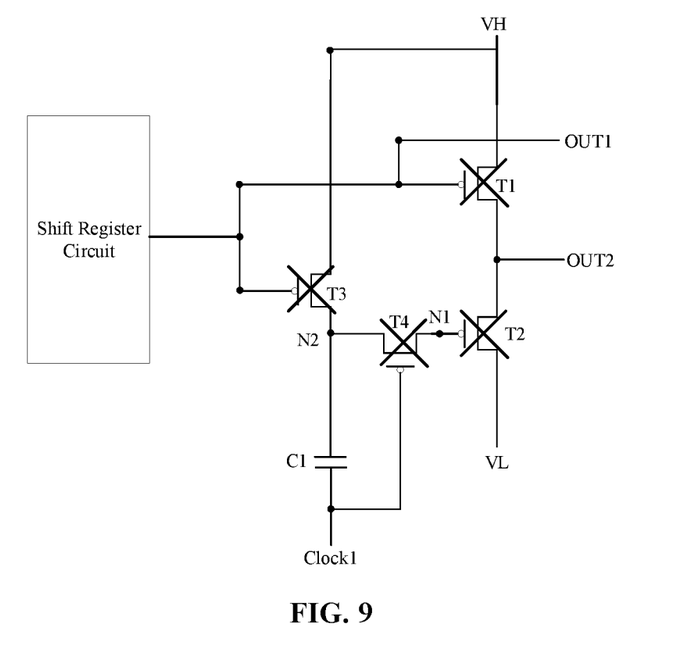
Figure 10:
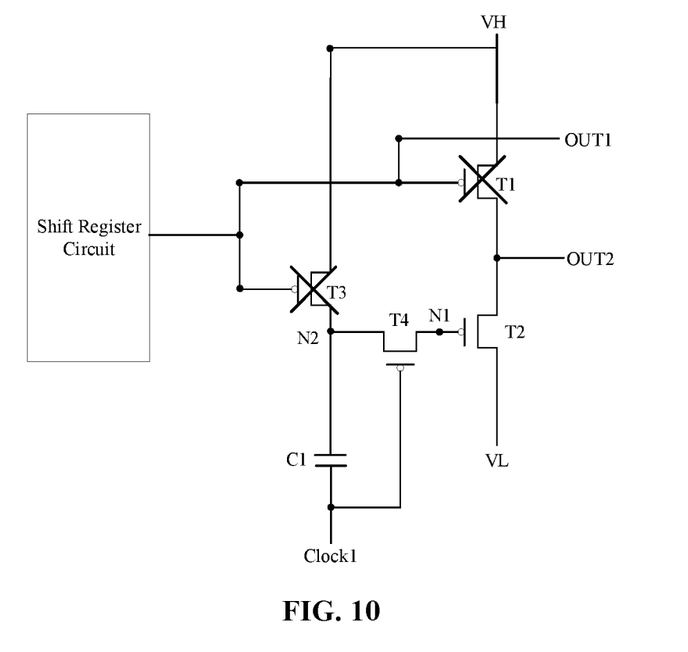

In some exemplary embodiments, as shown in FIG. 6, it is a timing diagram of some nodes in the shift register of FIG. 5. Herein, OUT1($n$) represents the timing diagram of the first output terminal of the n-th stage of shift register, OUT1($n$+1) represents the timing diagram of the first output terminal of the (n+1)-th stage of shift register, OUT2($n$) represents the timing diagram of the second output terminal of the n-th stage of shift register, and Clock1 represents the timing diagram of the first clock signal terminal Clock of the n-th stage of shift register. This exemplary embodiment is described while taking the n-th stage of shift register as an example. As shown in FIGS. 7-10, state diagrams of the shift register in FIG. 5 in different driving periods are illustrated. The driving method of the shift register includes four stages, wherein the first power terminal constantly outputs a high-level signal, and the second power terminal constantly outputs a low-level signal. In the first stage T1, the first output terminal OUT1 outputs a high-level signal, the first clock signal terminal Clock1 outputs a high-level signal, as shown in FIG. 7, the first switch to the fourth switch are all turned off, and the second output terminal OUT2 maintains the low-level signal of the previous frame. In the second stage T2, the first output terminal OUT1 outputs a low-level signal, the first clock signal terminal Clock1 outputs a low-level signal, as shown in FIG. 8, the first switch T1, the third switch T3, and the fourth switch T4 are turned on, the second switch is turned off, and the second output terminal OUT2 outputs a high-level signal. In the third stage T3, the first output terminal OUT1 outputs a high-level signal, the first clock signal terminal Clock1 outputs a high-level signal, as shown in FIG. 9, the first switch to the fourth switch are all turned off, and the second output terminal OUT2 maintains a high-level signal, and at the same time, in the third stage T3, the (n+1)-th stage of shift register outputs a low-level signal. In the fourth stage T4, the first output terminal OUT1 outputs a high-level signal, and the first clock signal terminal Clock1 outputs a low-level signal; as shown in FIG. 10, the fourth switch T4 is turned on, and the first switch T1 and the third switch T3 are turned off; since the signal at the first clock signal terminal changes from high to low, under the bootstrap action of the first capacitor C1, the potential of the second node N2 changes from high to low, thereby turning on the second switch T2, such that the second output terminal OUT2 outputs a low-level signal.

Figure 11:
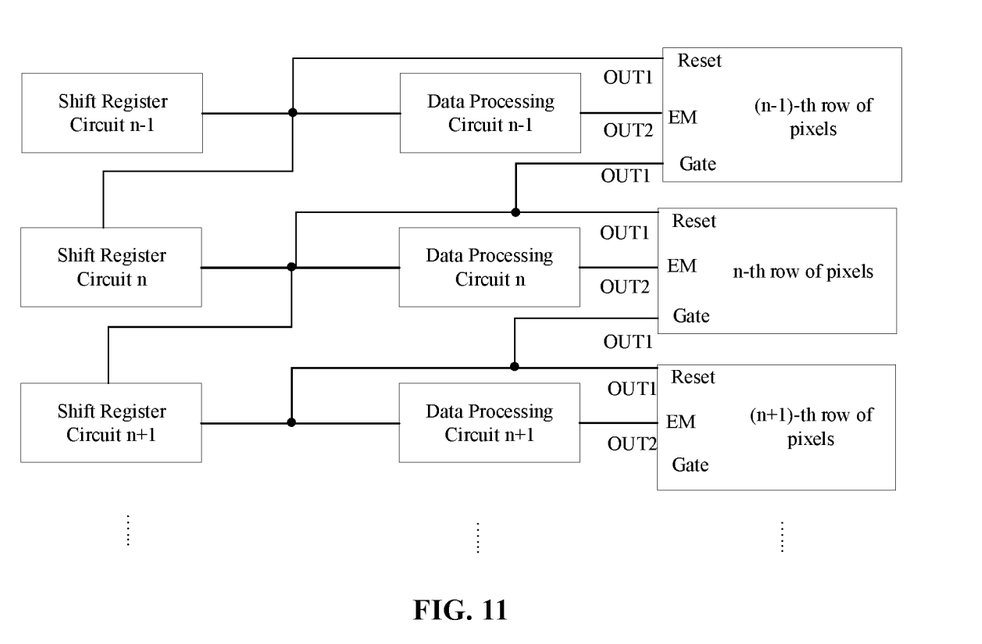
FIG. 11 is a schematic block diagram of the gate driving circuit according to an exemplary embodiment of the disclosure.

Some exemplary embodiments also provide a gate driving circuit, as shown in FIG. 11, which is a schematic block diagram of the gate driving circuit according to an exemplary embodiment of the disclosure. The gate driving circuit includes a plurality of the above-mentioned shift registers cascaded, wherein the first output terminal of the shift register of the previous stage is connected to the input signal terminal of the shift register of the next stage. The first output terminal OUT1 in the n-th stage of shift register is connected to the reset signal terminal Reset in the n-th row of pixel units to provide a reset signal to the pixel driving circuit. The second output terminal OUT2 in the n-th stage of shift register is connected to the enable signal terminal EM in the n-th row of pixel units to provide an enable signal to the pixel driving circuit. The first output terminal OUT1 in the (n+1)-th stage of shift register is connected to the gate driving signal terminal Gate of the n-th row of pixel units to provide a gate driving signal to the pixel driving circuit; where n is a positive integer greater than or equal to 1. In some exemplary embodiments, the number of stages of the shift registers is greater than the number of rows of pixel units in the display panel by one, and the first output terminal in the last stage of shift register is configured to provide a gate driving signal to the last row of pixel units. By connecting the shift register in FIG. 5 with the pixel driving circuit in FIG. 1 in the manner shown in FIG. 11, it is possible to simultaneously provide the enable signal, the gate driving signal, and the reset signal to the pixel driving circuit only through the shift register. Therefore, the arrangement of additional driving circuits and signal lines corresponding to the enable signal and the reset signal can be avoided, and the driving circuit in the display panel can be simplified.

Figure 12:
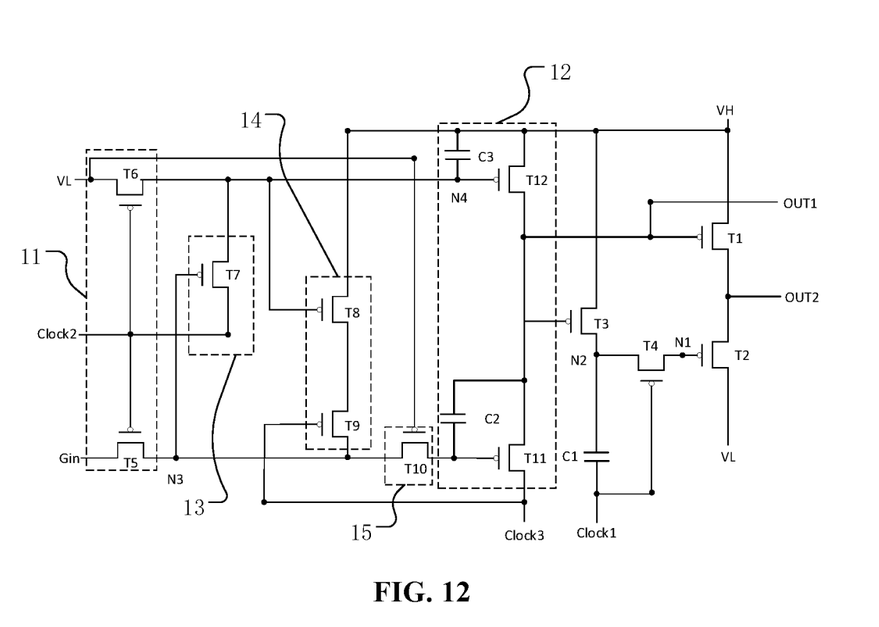
FIG. 12 is a schematic block diagram of the shift register according to another exemplary embodiment of the disclosure.

In some exemplary embodiments, as shown in FIG. 12, it is a schematic block diagram of the shift register according to another exemplary embodiment of the disclosure. The shift register circuit includes: an input circuit 11, an output circuit 12, a first pull-up circuit 13, and a second pull-up circuit 14. The input circuit 11 is connected to the second power terminal VL, the second clock signal terminal Clock2, the input signal terminal Gin, the third node N3 and the fourth node N4, and is configured to transmit, in response to a signal of the second clock signal terminal Clock2, a signal of the second power terminal VL to the fourth node N4, and transmit, in response to a signal of the second clock signal terminal Clock2, a signal of the input signal terminal Gin to the third node N3. The output circuit 12 is connected to the first power terminal VH, the fourth node N4, the third clock signal terminal Clock3, the third node N3, and the first output terminal OUT1, is configured to transmit, in response to a signal of the fourth node N4, a signal of the first power terminal VH to the first output terminal OUT1, and transmit, in response to a signal of the third node N3, a signal of the third clock signal terminal Clock3 to the first output terminal OUT1. The first pull-up circuit 13 is connected to the second clock signal terminal Clock2, the third node N3, and the fourth node N4, and is configured to transmit, in response to a signal of the third node n3, a signal of the second clock signal terminal Clock2 to the fourth node N4. The second pull-up circuit 14 is connected to the third node N3, the fourth node N4, the first power terminal VH, and the third clock signal terminal Clock3, and is configured to transmit, in response to signals of the fourth node N4 and the third clock signal terminal Clock3, a signal of the first power terminal VH to the third node N3.

In some exemplary embodiments, the shift register circuit may further include an isolation circuit 15. The isolation circuit 15 is connected to the second power terminal VL, the third node N3, and the output circuit 12, and is configured to conduct, in response to a signal of the second power terminal VL, the third node N3 and the output circuit 12.

In some exemplary embodiments, the input circuit 11 includes a fifth switch T5 and a sixth switch T6. The control terminal of the fifth switch T5 is connected to the second clock signal terminal Clock2, the first terminal thereof is connected to the input signal terminal Gin, and the second terminal thereof is connected to the third node N3. The control terminal of the sixth switch T6 is connected to the second clock signal terminal Clock2, the first terminal thereof is connected to the second power terminal VL, and the second terminal thereof is connected to the fourth node N4. The isolation circuit 15 includes a tenth switch T10, the control terminal of the tenth switch T10 is connected to the second power terminal VL, the first terminal thereof is connected to the third node N3. The output circuit 12 includes an eleventh switch T11, a twelfth switch T12, a second capacitor C2 and a third capacitor C3; the control terminal of the eleventh switch T11 is connected to the second terminal of the tenth switch T10, the first terminal thereof is connected to the third clock signal terminal Clock3, and the second terminal thereof is connected to the first output terminal OUT1; the control terminal of the twelfth switch T12 is connected to the fourth node N4, the first terminal thereof is connected to the first power terminal VH, and the second terminal thereof is connected to the first output terminal OUT1; the second capacitor C2 is connected between the second terminal of the tenth switch and the first output terminal OUT1; the third capacitor C3 is connected between the first power terminal VH and the fourth node N4. The first pull-up circuit 13 includes a T7, the control terminal of the seventh switch T7 is connected to the third node N3, the first terminal thereof is connected to the second clock signal terminal Clock2, and the second terminal thereof is connected to the fourth node N4. The second pull-up circuit 14 includes an eighth switch T8 and the ninth switch T9; the control terminal of the eighth switch T8 is connected to the fourth node N4, the first terminal thereof is connected to the first power terminal VH; the control terminal of the ninth switch T9 is connected to the third clock signal terminal Clock3, the first terminal thereof is connected to the second terminal of the eighth switch T8. The tenth switch T10 is configured to isolate the first output terminal OUT1 and the input signal terminal Gin, and is used for reducing the influence of the voltage change of the first output terminal OUT1 on the voltage of the input signal terminal Gin.

In some exemplary embodiments, the fifth switch to the twelfth switch may be P-type transistors or N-type transistors. As shown in FIG. 5, the description of the exemplary embodiments is made while taking an example in which the fifth switch to the twelfth switch are P-type transistors.

The driving method of the shift register will be described in detail below in conjunction with the shift register circuit.

Figure 13:
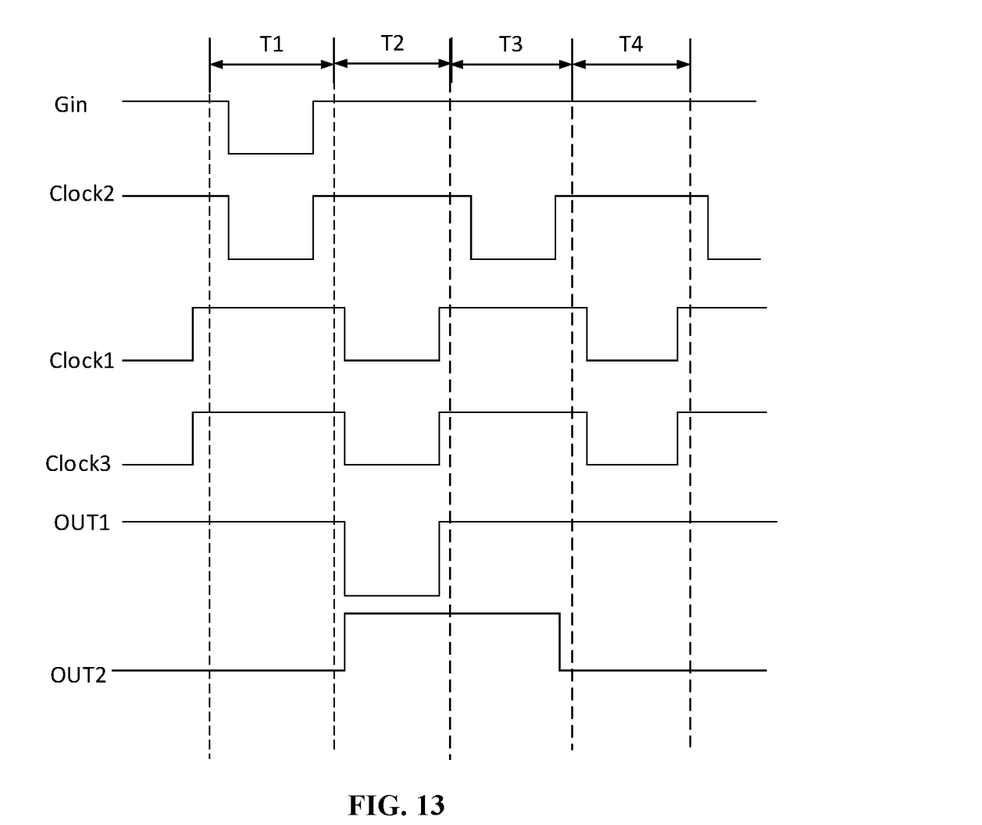
FIG. 13 is a timing diagram of some nodes in the shift register of FIG. 12.

As shown in FIG. 13, it is a timing diagram of some nodes in the shift register of FIG. 12. As shown in FIGS. 14-17, state diagrams of the shift register in FIG. 12 during different driving periods are illustrated. The driving method of the shift register includes four stages, wherein the first power terminal constantly outputs a high-level signal, and the second power terminal constantly outputs a low-level signal.

Figure 14:
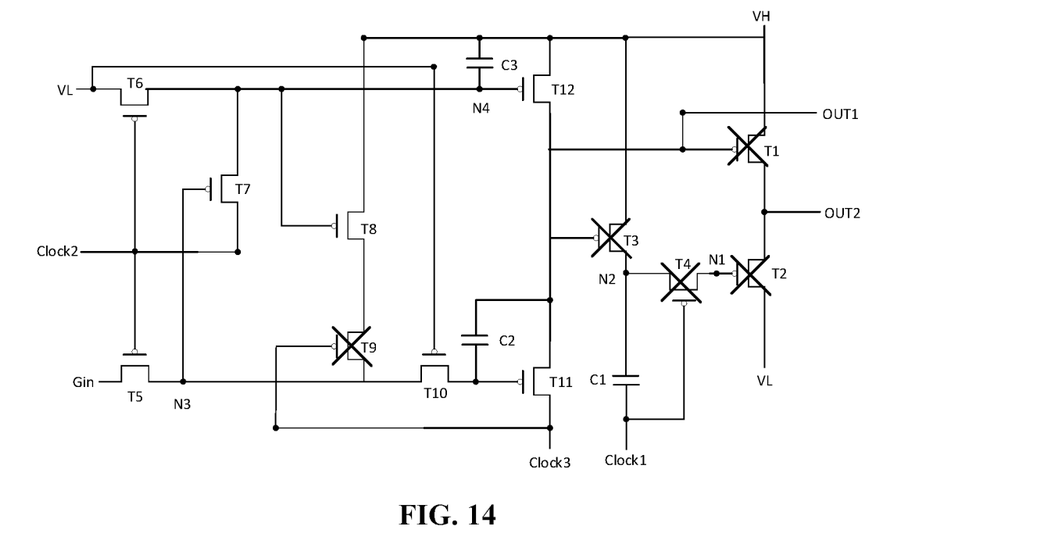
FIGS. 14-17 are state diagrams of the shift register in FIG. 12 during different driving periods.

In the first stage T1, the input signal terminal Gin inputs a low-level signal, the first clock signal terminal Clock1 outputs a high-level signal, the second clock signal terminal Clock2 inputs a low-level signal, and the third clock signal terminal Clock3 outputs a high-level signal. As shown in FIG. 14, the fifth switch T5, the sixth switch T6, the seventh switch T7, the eighth switch T8, the tenth switch T10, the eleventh switch T11, and the twelfth switch T12 are turned on, the ninth switch is turned off, and the first output terminal OUT1 outputs a high-level signal. The first switch to the fourth switch are all turned off, and the second output terminal OUT2 maintains the low-level signal of the previous frame.

Figure 15:
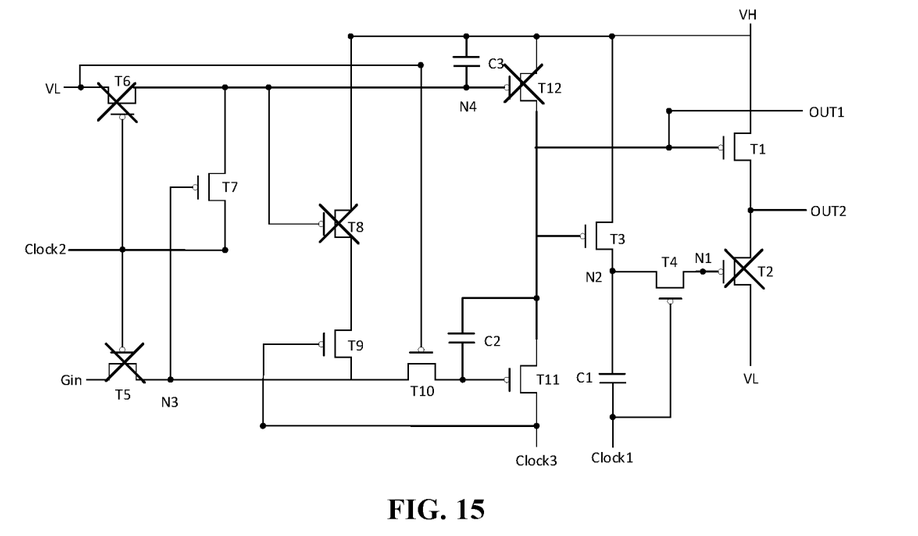

In the second stage T2, the input signal terminal Gin inputs a high-level signal, the first clock signal terminal Clock1 outputs a low-level signal, the second clock signal terminal Clock2 inputs a high-level signal, and the third clock signal terminal Clock3 outputs a low-level signal. signal. As shown in FIG. 15, the fifth switch T5, the sixth switch T6, the eighth switch T8, and the twelfth switch T12 are turned off, and the seventh switch T7, the ninth switch T9, the tenth switch T10 and the eleventh switch T11 are turned on, the first output terminal OUT1 outputs a low-level signal, the first switch T1, the third switch T3, and the fourth switch T4 are turned on, and the second switch is turned off. The second output terminal OUT2 outputs a high-level signal.

Figure 16:
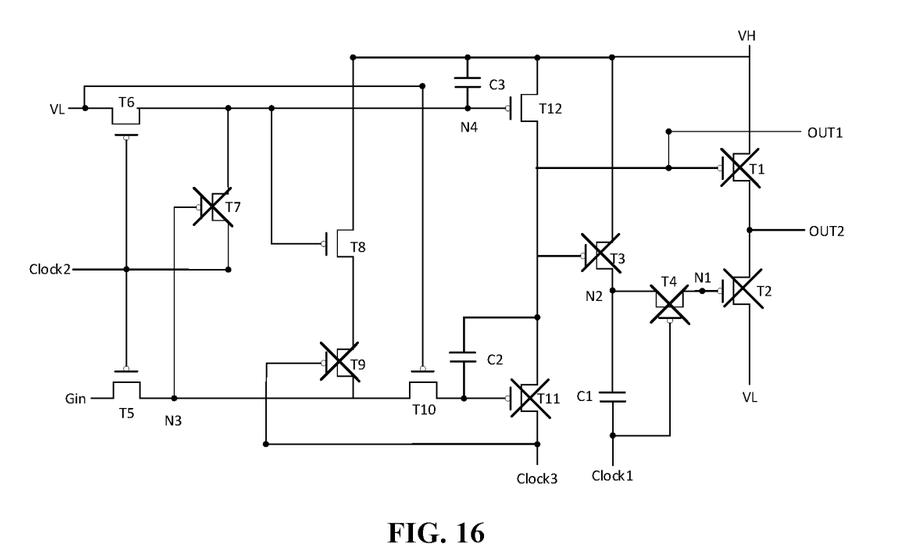

In the third stage T3, the input signal terminal Gin inputs a high-level signal, the first clock signal terminal Clock1 outputs a high-level signal, the second clock signal terminal Clock2 inputs a low-level signal, and the third clock signal terminal Clock3 outputs a high-level signal. As shown in FIG. 16, the fifth switch T5, the sixth switch T6, the eighth switch T8, the twelfth switch T12, and the tenth switch T10 are turned on, and the seventh switch T7, the ninth switch T9 and the eleventh switch T11 are turned off, the first output terminal OUT1 outputs a high-level signal. The first switch to the fourth switch are all turned off, and the second output terminal OUT2 maintains a high-level signal.

Figure 17:
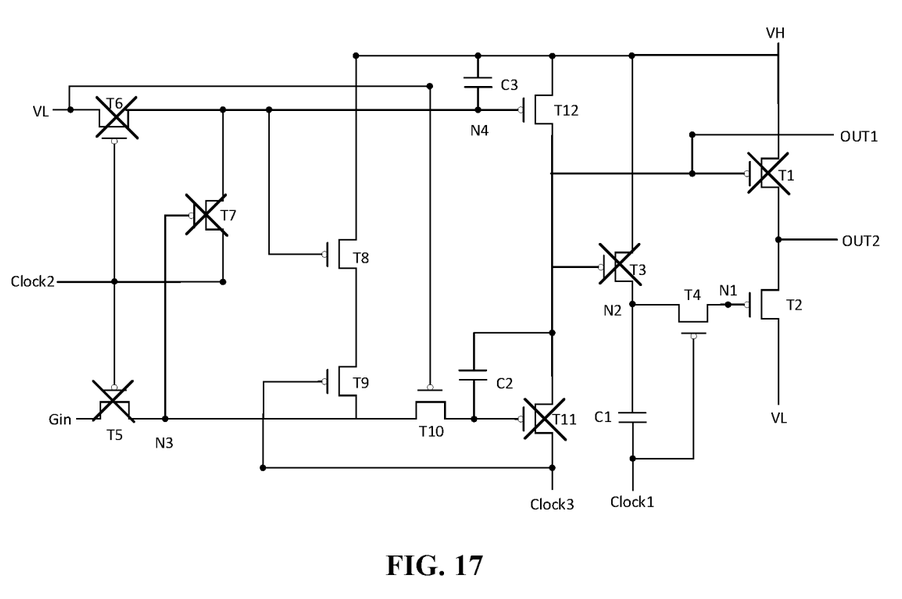

In the fourth stage T4, the input signal terminal Gin inputs a high-level signal, the first clock signal terminal Clock1 outputs a low-level signal, the second clock signal terminal Clock2 inputs a high-level signal, and the third clock signal terminal Clock3 outputs a low-level signal. signal. As shown in FIG. 17, the fifth switch T5, the sixth switch T6, the seventh switch T7, and the eleventh switch T11 are turned off, and the eighth switch T8, the ninth switch T9, the tenth switch T10 and the twelfth switch T12 are turned on, the first output terminal OUT1 outputs a high-level signal, the fourth switch T4 is turned on, the first switch T1 and the third switch T3 are turned off. Sine the signal at the first clock signal terminal changes high level to low level, under the bootstrap action of the first capacitor C1, the potential of the second node N2 changes from high level to low level, so that the second switch T2 is turned on, and the second output terminal OUT2 outputs a low-level signal.

In some exemplary embodiments, as can be seen from FIG. 13, the timings of the first clock signal terminal and the third clock signal terminal are the same. Therefore, the first clock signal terminal and the third clock signal terminal can share the same signal terminal.

According some exemplary embodiments of the disclosure, there is also provided a shift register driving method for driving the shift register as described above, including:

outputting the first shift signal to the first output terminal using the shift register circuit; and outputting, according to the first shift signal of the first output terminal, the second shift signal to the second output terminal using the data processing circuit.

In some exemplary embodiments of the disclosure, the data processing circuit includes an output sub-circuit and a control sub-circuit, and the method further includes:

using the output sub-circuit to transmit, according to a signal of the first output terminal, a signal of the first power terminal to the second output terminal, or transmit, according to a signal of the first node, a signal of the second power terminal to the second output terminal; and using the control sub-circuit to input, according to a signal of the first output terminal, a control signal to the first node.

In some exemplary embodiments of the disclosure, the output sub-circuit includes a first switch and a second switch, the control sub-circuit includes a third switch and a fourth switch, and the method further includes:

in a first stage, outputting, using the shift register circuit, an invalid level signal to the first output terminal, and inputting the invalid level signal to the first clock signal terminal;

in a second stage, outputting, using the shift register circuit, a valid level signal to the first output terminal, and inputting the valid level signal to the first clock signal terminal;

in a third stage, outputting, using the shift register circuit, the invalid level signal to the first output terminal, and inputting the invalid level signal to the first clock signal terminal; and in a fourth stage, outputting, using the shift register circuit, the invalid level signal to the first output terminal, and inputting the valid level signal to the first clock signal terminal.

In some exemplary embodiments of the disclosure, the shift register is applied to a gate driving circuit of a display panel, and the second shift signal is used as an enable signal of a pixel driving circuit in the display panel.

As to the driving method of the shift register provided by the exemplary embodiments, the content has been described in detail as above, and will not be repeated here.

The exemplary embodiments also provides a display panel including the above-mentioned gate driving circuit.

Those skilled in the art will easily think of other embodiments of the disclosure after understanding the specification and practicing the embodiments disclosed herein. The disclosure is intended to cover any variations, uses, or adaptive changes of the disclosure, as long as these variations, uses, or adaptive changes follow the general principles of the disclosure and include common knowledge or conventional technical means in the technical field that are not disclosed in the disclosure. The description and the embodiments are only regarded as exemplary, and the true scope and spirit of the disclosure are limited by the claims.

It should be understood that the present disclosure is not limited to the precise structure that has been described above and shown in the drawings, and various modifications and changes can be made without departing from its scope. The scope of the present disclosure is limited only by the appended claims.

What is claimed is:

1. A shift register, comprising:
  a shift register circuit configured to output a first shift signal to a first output terminal; and
  a data processing circuit connected to the first output terminal and a second output terminal, and configured to output a second shift signal to the second output terminal according to the first shift signal of the first output terminal, wherein the data processing circuit comprises:
  an output sub-circuit connected to the first output terminal, the second output terminal, a first power terminal, a second power terminal, and a first node, and configured to transmit, according to a signal of the first output terminal, a signal of the first power terminal to the second output terminal, or transmit, according to a signal of the first node, a signal of the second power terminal to the second output terminal; and
  a control sub-circuit connected to the first output terminal, a first clock signal terminal, and the first node, and configured to input, according to signals of the first output terminal and the first clock signal terminal, a control signal to the first node, wherein the control sub-circuit comprises:

a first switch provided with a control terminal connected to the first output terminal, a first terminal connected to the first power terminal, and a second terminal connected to a second node;

a second switch provided with a control terminal connected to the first clock signal terminal, a first terminal connected to the second node, and a second terminal connected to the first node; and a first capacitor connected between the first clock signal terminal and the second node.

2. The shift register according to claim 1, wherein the output sub-circuit comprises:

a third switch provided with a control terminal connected to the first output terminal, a first terminal connected to the first power terminal, and a second terminal connected to the second output terminal; and a fourth switch provided with a control terminal connected to the first node, a first terminal connected to the second power terminal, and a second terminal connected to the second output terminal.

3. The shift register according to claim 1, wherein the shift register is applied to a gate driving circuit of a display panel, the first shift signal is used as a gate driving signal and a reset signal of a pixel driving circuit in the display panel, and the second shift signal is used as an enable signal of the pixel driving circuit in the display panel.

4. The shift register according to claim 1, wherein the shift register circuit comprises:

an input circuit connected to the second power terminal, a second clock signal terminal, an input signal terminal, a third node, and a fourth node, and configured to transmit, in response to a signal of the second clock signal terminal, a signal of the second power terminal to the fourth node, and transmit, in response to a signal of the second clock signal terminal, a signal of the input signal terminal to the third node;

an output circuit connected to the first power terminal, the fourth node, a third clock signal terminal, the third node, and the first output terminal, and configured to transmit, in response to a signal of the fourth node, a signal of the first power terminal to the first output terminal, and transmit, in response to a signal of the third node, a signal of the third clock signal terminal to the first output terminal;

a first pull-up circuit connected to the second clock signal terminal, the third node, and the fourth node, and configured to transmit, in response to a signal of the third node, a signal of the second clock signal terminal to the fourth node; and a second pull-up circuit connected to the third node, the fourth node, the first power terminal, and the third clock signal terminal, and configured to transmit, in response to signals of the fourth node and the third clock signal terminal, a signal of the first power terminal to the third node.

5. The shift register according to claim 4, wherein the shift register circuit further comprises an isolation circuit connected to the second power terminal, the third node, and the output circuit, and configured to conduct, in response to a signal of the second power terminal, the third node and the output circuit.

6. The shift register according to claim 5, wherein:
the input circuit comprises:
a fifth switch provided with a control terminal connected to the second clock signal terminal, a first terminal connected to the input signal terminal, and a second terminal connected to the third node; and a sixth switch provided with a control terminal connected to the second clock signal terminal, a first terminal connected to the second power terminal, and a second terminal connected to the fourth node;

the isolation circuit comprises a tenth switch provided with a control terminal connected to the second power terminal, and a first terminal connected to the third node;

the output circuit comprises:
an eleventh switch, provided with a control terminal connected to a second terminal of the tenth switch, a first terminal connected to the third clock signal terminal, and a second terminal connected to the first output terminal;

a twelfth switch, provided with a control terminal connected to the fourth node, a first terminal connected to the first power terminal, and a second terminal connected to the first output terminal;

a second capacitor, connected between the second terminal of the tenth switch and the first output terminal; and a third capacitor, connected between the first power terminal and the fourth node;

the first pull-up circuit comprises a seventh switch provided with a control terminal connected to the third node, a first terminal connected to the second clock signal terminal, and a second terminal connected to the fourth node; and the second pull-up circuit comprises:
an eighth switch provided with a control terminal connected to the fourth node, and a first terminal connected to the first power terminal; and a ninth switch provided with a control terminal connected to the third clock signal terminal, and a first terminal connected to a second terminal of the eighth switch.

7. The shift register according to claim 6, wherein the first clock signal terminal and the third clock signal terminal share a same signal terminal.

8. A shift register driving method for driving a shift register, comprising:

providing the shift register, the shift register comprising a shift register circuit configured to output a first shift signal to a first output terminal, and a data processing circuit connected to the first output terminal and a second output terminal;

outputting the first shift signal to the first output terminal using the shift register circuit; and outputting, according to the first shift signal of the first output terminal, the second shift signal to the second output terminal using the data processing circuit, wherein the data processing circuit comprises an output sub-circuit and a control sub-circuit, the output sub-circuit is connected to the first output terminal, the second output terminal, a first power terminal, a second power terminal, and a first node, the control sub-circuit is connected to the first output terminal, a first clock signal terminal, and the first node, and the method further comprises:

in a first stage, outputting, using the shift register circuit, an invalid level signal to the first output terminal, and inputting the invalid level signal to the first clock signal terminal;

in a second stage, outputting, using the shift register circuit, a valid level signal to the first output terminal, and inputting the valid level signal to the first clock signal terminal;

in a third stage, outputting, using the shift register circuit, the invalid level signal to the first output terminal, and inputting the invalid level signal to the first clock signal terminal; and in a fourth stage, outputting, using the shift register circuit, the invalid level signal to the first output terminal, and inputting the valid level signal to the first clock signal terminal, and wherein the control sub-circuit comprises:

a first switch provided with a control terminal connected to the first output terminal, a first terminal connected to the first power terminal, and a second terminal connected to a second node;

a second switch provided with a control terminal connected to the first clock signal terminal, a first terminal connected to the second node, and a second terminal connected to the first node; and a first capacitor connected between the first clock signal terminal and the second node.

9. A gate driving circuit, comprising:

a plurality of shift registers, wherein the plurality of the shift registers are cascaded, each of the plurality of shift registers comprising:

a shift register circuit configured to output a first shift signal to a first output terminal; and a data processing circuit connected to the first output terminal and a second output terminal, and configured to output a second shift signal to the second output terminal according to the first shift signal of the first output terminal; and a first output terminal in a previous stage of shift register is connected to an input signal terminal in a next stage of shift register, wherein the data processing circuit comprises:

an output sub-circuit connected to the first output terminal, the second output terminal, a first power terminal, a second power terminal, and a first node, and configured to transmit, according to a signal of the first output terminal, a signal of the first power terminal to the second output terminal, or transmit, according to a signal of the first node, a signal of the second power terminal to the second output terminal; and a control sub-circuit connected to the first output terminal, a first clock signal terminal, and the first node, and configured to input, according to signals of the first output terminal and the first clock signal terminal, a control signal to the first node, wherein the control sub-circuit comprises:

a first switch provided with a control terminal connected to the first output terminal, a first terminal connected to the first power terminal, and a second terminal connected to a second node;

a second switch provided with a control terminal connected to the first clock signal terminal, a first terminal connected to the second node, and a second terminal connected to the first node; and a first capacitor connected between the first clock signal terminal and the second node.

10. The gate driving circuit according to claim 9, wherein the gate driving circuit is applied to a display panel;

the first output terminal in a n-th stage of shift register is configured to provide a reset signal to a n-th row of pixel unit in the display panel;

the second output terminal in the n-th stage of shift register is configured to provide an enable signal to the n-th row of pixel unit in the display panel; and the first output terminal in a (n+1)-th stage of shift register is configured to provide a gate driving signal to the n-th row of pixel unit in the display panel;

where n is a positive integer greater than or equal to 1.

11. The gate driving circuit according to claim 10, wherein a number of stages of the shift register is greater than a number of rows of pixel units in the display panel by 1, and the first output terminal in a last stage of shift register is configured to provide a gate driving signal to a last row of pixel unit.

12. The gate driving circuit according to claim 11, wherein the gate driving circuit is part of a display panel.

13. The gate driving circuit according to claim 10, wherein the gate driving circuit is part of a display panel.

14. The gate driving circuit according to claim 9, wherein the first shift signal is used as a gate driving signal and a reset signal of a pixel driving circuit in a display panel, and the second shift signal is used as an enable signal of the pixel driving circuit in the display panel.

15. The gate driving circuit according to claim 9, wherein the gate driving circuit is part of a display panel.

* * * * *